(12) United States Patent
Fischer-Carne et al.

(10) Patent No.: US 12,360,163 B2
(45) Date of Patent: *Jul. 15, 2025

(54) TESTING SYSTEM THAT DETERMINES CONTACT EROSION IN CIRCUIT BREAKER

(71) Applicant: JST POWER EQUIPMENT, INC., Lake Mary, FL (US)

(72) Inventors: Patrick R. Fischer-Carne, New Smyrna Beach, FL (US); Matthew Polk, Lake Mary, FL (US)

(73) Assignee: JST POWER EQUIPMENT, INC., Lake Mary, FL (US)

( * ) Notice: Subject to any disclaimer, the term of this patent is extended or adjusted under 35 U.S.C. 154(b) by 190 days.

This patent is subject to a terminal disclaimer.

(21) Appl. No.: 18/353,918

(22) Filed: Jul. 18, 2023

(65) Prior Publication Data

US 2023/0358808 A1 Nov. 9, 2023

Related U.S. Application Data

(63) Continuation of application No. 17/557,194, filed on Dec. 21, 2021, now Pat. No. 11,860,230.

(51) Int. Cl.
*G01R 31/327* (2006.01)
*H01H 1/14* (2006.01)
*H01H 9/02* (2006.01)

(52) U.S. Cl.
CPC ..... *G01R 31/3272* (2013.01); *G01R 31/3275* (2013.01); *H01H 1/14* (2013.01); *H01H 9/02* (2013.01)

(58) Field of Classification Search
None
See application file for complete search history.

(56) References Cited

U.S. PATENT DOCUMENTS

| 3,397,293 A | 8/1968 | Darrow et al. |
| 5,095,293 A | 3/1992 | Patel et al. |

(Continued)

FOREIGN PATENT DOCUMENTS

| CN | 102707180 A | 10/2012 |
| CN | 106449265 A | 2/2017 |

(Continued)

OTHER PUBLICATIONS

Liu et al., "A new identification method of high voltage circuit breaker mechanical fault based on combined analysis of time-reference-distance and shape entropy algorithms," IET Generation, Transmission & Distribution; www.wileyonlinelibrary.com/iet-gtd; 2022:16; pp. 3416-3425.

(Continued)

*Primary Examiner* — Nasima Monsur
(74) *Attorney, Agent, or Firm* — ALLEN, DYER, DOPPELT + GILCHRIST, PA

(57) ABSTRACT

A testing system includes a truck carrying a circuit breaker, a fixed contact, and an actuator piston connected to a movable contact. A test platform supports the truck in a contact testing position and includes a sensor circuit mounted on the test platform and positioned under the truck and aligned with the circuit breaker when the truck is on the test platform in the contact testing position. The sensor circuit is configured to acquire displacement data of the actuator piston when the movable electrical contact is moved between the open and closed positions. A controller is coupled to the sensor circuit and configured to receive the displacement data and determine electrical contact erosion within the circuit breaker.

21 Claims, 9 Drawing Sheets

(56) References Cited

U.S. PATENT DOCUMENTS

| | | | |
|---|---|---|---|
| 6,002,560 A | 12/1999 | Nguyen et al. | |
| 6,150,625 A | 11/2000 | Marchand et al. | |
| 8,289,036 B2 | 10/2012 | Bataille et al. | |
| 8,304,672 B2 | 11/2012 | Lee et al. | |
| 8,952,826 B2 | 2/2015 | Leccia et al. | |
| 9,378,901 B2 | 6/2016 | Ashtekar et al. | |
| 9,490,084 B2 | 11/2016 | Ashtekar et al. | |
| 9,515,462 B2 | 12/2016 | Capelli et al. | |
| 9,704,657 B2 | 7/2017 | Ashtekar et al. | |
| 9,748,053 B2 | 8/2017 | Ashtekar et al. | |
| 10,312,670 B2 | 6/2019 | Zhang et al. | |
| 10,424,444 B2 | 9/2019 | Yang et al. | |
| 10,533,978 B2 | 1/2020 | Benke et al. | |
| 11,004,619 B2 | 5/2021 | Ashtekar | |
| 11,860,230 B2 * | 1/2024 | Fischer-Carne | H01H 1/0015 |
| 2005/0063107 A1 | 3/2005 | Benke | |
| 2014/0090965 A1 | 4/2014 | Leccia et al. | |
| 2016/0141117 A1 | 5/2016 | Ashtekar et al. | |
| 2016/0141136 A1 | 5/2016 | Ashtekar et al. | |
| 2016/0225543 A1 * | 8/2016 | Ashtekar | H01H 1/0015 |
| 2016/0268076 A1 | 9/2016 | Urasaki et al. | |
| 2016/0379787 A1 | 12/2016 | Ashtekar et al. | |
| 2017/0045481 A1 | 2/2017 | Benke et al. | |
| 2017/0047181 A1 * | 2/2017 | Yang | H01H 3/3005 |
| 2017/0194113 A1 | 7/2017 | Yang et al. | |
| 2018/0090913 A1 | 3/2018 | Johnson et al. | |
| 2020/0194191 A1 * | 6/2020 | Ashtekar | G01R 31/3333 |
| 2022/0199341 A1 | 6/2022 | Choi | |
| 2022/0270840 A1 | 8/2022 | Hanna et al. | |
| 2022/0271516 A1 | 8/2022 | Hanna et al. | |
| 2022/0271517 A1 | 8/2022 | Hanna et al. | |
| 2022/0271518 A1 | 8/2022 | Hanna et al. | |
| 2022/0271519 A1 | 8/2022 | Hanna et al. | |
| 2023/0194609 A1 | 6/2023 | Fischer-Carne et al. | |
| 2023/0197362 A1 | 6/2023 | Fischer-Carne et al. | |

FOREIGN PATENT DOCUMENTS

| | | |
|---|---|---|
| CN | 106653469 A | 5/2017 |
| CN | 206180452 U | 5/2017 |
| CN | 106842009 A | 6/2017 |
| CN | 107797058 A | 3/2018 |
| CN | 207502680 U | 6/2018 |
| CN | 109066420 A | 12/2018 |
| CN | 110542850 A | 12/2019 |
| CN | 106443426 B | 10/2020 |
| EP | 2869414 A1 | 5/2015 |
| EP | 3573084 A1 | 11/2019 |
| JP | 6971455 B2 | 11/2021 |
| KR | 101201711 | 11/2012 |
| WO | 2019/141529 A1 | 7/2019 |
| WO | 2020/171327 | 8/2020 |
| WO | 2020/204377 A1 | 10/2020 |
| WO | 2020/209507 A1 | 10/2020 |

OTHER PUBLICATIONS

Megger; DDA-3000 and DDA-6000—Universal Circuit Breaker Test Sets; www.megger.com; Jan. 2021.

Megger; PS-9116—Microprocessor-Based Circuit Breaker Test Sets; www.megger.com; Sep. 2020.

Megger; PS-9130 and PS-9160—Universal Circuit Breaker Test Sets; www.megger.com; Dec. 2016.

* cited by examiner

TESTING SYSTEM THAT DETERMINES CONTACT EROSION IN CIRCUIT BREAKER

PRIORITY APPLICATION(S)

This is a continuation application based upon U.S. patent application Ser. No. 17/557,194 filed Dec. 21, 2021, the disclosure which is hereby incorporated by reference in its entirety.

FIELD OF THE INVENTION

The present invention relates to the field of electrical systems, and more particularly, this invention relates to electrical switchgear systems having circuit breakers.

BACKGROUND OF THE INVENTION

Metal-clad or metal-enclosed medium voltage switchgear systems operate as three-phase systems that connect to the three-phase power distribution grid and provide various control functions and provide protection against short circuit events and similar overcurrent or other fault conditions. The switchgear systems may include transformers to reduce the primary circuit voltage, which can be greater than 1,000 volts, to a much lower voltage that may energize control circuits or monitor or meter the primary voltage. The switchgear systems and associated load currents may be protected from damage by a fuse when the transformers fail. Switchgear systems may also incorporate circuit breakers, which open and close individual circuits and may be mounted on a truck, which may be racked in and out of a switchgear housing via a racking system. The circuit breakers may be connected and disconnected not only from primary circuits, but also may be connected and disconnected from a secondary control power circuit. Short circuit events and similar overcurrent or other fault conditions may generate very large currents, which places physical stresses on the circuit breakers and the racking system.

Switchgear circuit breakers may include vacuum interrupters that operate as switching devices, and include a fixed electrical contact positioned within a vacuum sealed breaker housing, and a movable electrical contact mounted for movement in the breaker housing. An actuator piston and a drive assembly may be coupled to the actuator piston and may have stored energy, such that the contacts are normally closed, but are opened upon an electrical fault condition, such as a current overload, short circuit, or abnormal level voltage condition.

Usually, one vacuum interrupter as a circuit breaker is provided for each phase of a multi-phase circuit such as a three-phase circuit, and the several phases are actuated simultaneously by a common operating mechanism, or in some cases separately. Over the life of each vacuum interrupter, the contact surfaces may erode because of the arcing that occurs between the contacts during a circuit interruption. As a result, each contact may lose material over its life due to contact erosion. For example, it is possible that each contact may lose about 3 to 5 millimeters (mm) of material in a system that has about 14 millimeters of contact movement. As a result, some of the compression that may be associated with spring mechanisms as part of the vacuum interrupter may be lost. The contact erosion may also create insufficient contact force between the contacts, and thus, increase the risk of overheating or explosion in the event of a short circuit and failure to interrupt the circuit. There have been some proposals to monitor contact wear, such as adding optical or electronic measuring devices or mechanical gauges into the vacuum interrupter itself, but often space is limited within the circuit breaker, making it difficult to determine electrical contact erosion within a circuit breaker.

SUMMARY OF THE INVENTION

This summary is provided to introduce a selection of concepts that are further described below in the Detailed Description. This summary is not intended to identify key or essential features of the claimed subject matter, nor is it intended to be used as an aid in limiting the scope of the claimed subject matter.

In general, a testing system for a circuit breaker may comprise a truck carrying a circuit breaker, wherein the circuit breaker may comprise a breaker housing, a fixed electrical contact and a movable electrical contact mounted within the breaker housing. The movable electrical contact may be movable between an open and closed position relative to the fixed electrical contact. An actuator piston may be connected to the movable electrical contact and extend downward from the breaker housing and may be configured to connect to a drive assembly that drives the actuator piston and moves the movable electrical contact between open and closed positions with the fixed electrical contact. A test platform may be configured to support the truck carrying the circuit breaker in a contact testing position on the test platform, which may comprise a sensor circuit mounted on the test platform and positioned under the truck and aligned with the circuit breaker when the truck is on the test platform in the contact testing position. The sensor circuit may be configured to acquire displacement data of the actuator piston when the movable electrical contact is moved between the open and closed positions. A controller may be coupled to the sensor circuit and configured to receive the displacement data and determine electrical contact erosion within the circuit breaker.

The sensor circuit may comprise a first laser configured to emit a first optical beam onto a surface of the actuator piston, and a first optical sensor that receives reflected light from the surface of the actuator piston. The sensor circuit may comprise a second laser configured to emit a second optical beam onto a surface of the breaker housing, and a second optical sensor that may receive reflected light from the surface of the breaker housing. The controller may be configured to determine actual electrical contact erosion based upon displacement of the actuator piston and breaker housing. The controller may be configured to recalibrate the position of the fixed and movable electrical contacts based upon the displacement data obtained from movement of the actuator piston and breaker housing. The truck may include a bottom panel having orifices aligned with respective first and second lasers to allow the first and second optical beams from the first and second lasers to pass upward through the bottom panel to respective surfaces of the actuator piston and breaker housing. The controller may be configured to determine actual contact erosion by subtracting the displacement of the breaker housing from the displacement of the actuator piston.

In an example, first, second and third circuit breakers may be carried on the truck, and first, second and third sensor circuits may be mounted on the test platform underneath the truck and aligned with respective first, second and third circuit breakers when the circuit breaker is in the contact testing position on the test platform. The first, second and third circuit breakers may be electrically connected in a three-phase circuit breaker configuration. The movable electrical contact may be opened from the fixed electrical contact in response to an abnormal electrical condition. The circuit breaker may include upper and lower terminals configured to engage electrical connectors carried within an interior compartment of a switchgear frame when the circuit breaker is in an electrically connected position. The actuator piston may comprise a spring and cylindrically configured actuator block engaging the spring. The breaker housing may comprise a vacuum chamber housing and the fixed and movable electrical contacts are sealed within the vacuum chamber housing.

A method aspect of operating a testing system for a circuit breaker may comprise positioning a truck carrying a circuit breaker into a contact testing position on a test platform. The circuit breaker may comprise a breaker housing, a fixed electrical contact and a movable electrical contact mounted within the breaker housing. The movable electrical contact may be movable between an open and closed position relative to the fixed electrical contact. An actuator piston may be connected to the movable electrical contact and extend downward from the breaker housing, and may be configured to connect to a drive assembly coupled to the actuator piston that drives the actuator piston and moves the movable electrical contact between open and closed positions with the fixed electrical contact. The method includes acquiring displacement data of the actuator piston when the movable electrical contact is moved between the open and closed positions using a sensor circuit mounted on the test platform and positioned under the truck and aligned with the circuit breaker when the truck is in the contact testing position, and receiving the displacement data within a controller coupled to the sensor circuit and determining electrical contact erosion within the circuit breaker.

BRIEF DESCRIPTION OF THE DRAWINGS

Other objects, features and advantages of the present invention will become apparent from the Detailed Description of the invention which follows, when considered in light of the accompanying drawings in which.

DETAILED DESCRIPTION

Different embodiments will now be described more fully hereinafter with reference to the accompanying drawings, in which preferred embodiments are shown. Many different forms can be set forth and described embodiments should not be construed as limited to the embodiments set forth herein. Rather, these embodiments are provided so that this disclosure will be thorough and complete, and will fully convey the scope to those skilled in the art.

Figure 1:
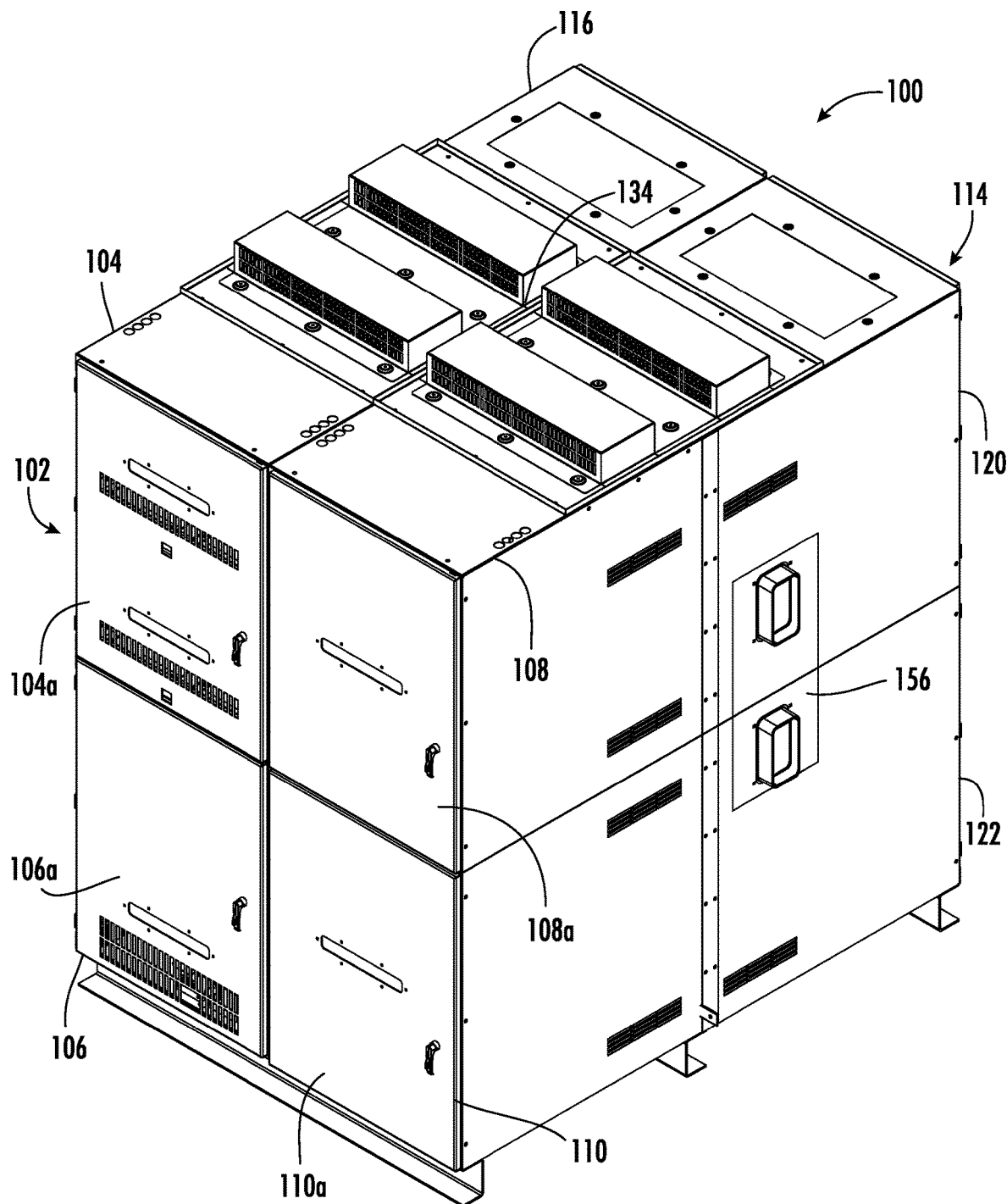
FIG. 1 is an isometric view of an example electrical switchgear system, in accordance with a non-limiting example.

Referring now to FIG. 1, there is illustrated generally at 100 an electrical switchgear system in accordance with a non-limiting example that includes a front switchgear section 102 having first and second sets of front upper and lower switchgear housings 104, 106, 108, 110 and having joined sidewalls. A rear switchgear section 114 includes first and second sets of rear upper and lower switchgear housings with three housings 116, 120, 122 being illustrated, and having joined sidewalls and connected to the rear of the respective front upper and lower switchgear housings 104, 106, 108, 110.

Joined sidewalls of first and second sets of front upper and lower switchgear housings 104, 106, 108, 110, 116, 120, 122 include a stepped offset section to form a ventilation duct 134 extending the height of the switchgear system 100. Each illustrated switchgear housing 104, 106, 108, 110, 116, 120, 122 includes a switchgear frame 124 (FIGS. 2-4) that defines an interior compartment 128 (FIG. 4).

It is possible that front and rear switchgear sections 102, 114 may include "n" sets of both front and rear upper and lower switchgear housings and form a series of switchgear housing sections forming the electrical switchgear system 100. In an example, the left front upper switchgear housing 104 may include within the interior compartment 128 upper and lower compartments where each of the upper and lower compartments may include the front opening defined at the front of the switchgear housing 104 and a truck and drive mechanism. The front left lower switchgear housing 106 in this example may include a circuit breaker truck 150 and circuit breaker drive mechanism 152 such as explained below in the more detail with reference to the description of FIG. 4.

The front switchgear section 102 upper and lower switchgear housings 104, 106, 108, 110 and rear switchgear section 114 having the upper and illustrated lower switchgear housings 116, 120, 122 each may include one or more interior compartments 128 (FIGS. 2, 4 and 5) and various electrical switchgear components. On the outside of the electrical switchgear system 100, and more particularly, on the outer side of the rear housings 120, 122 as shown in FIG. 1, there are shown components that make up part of a main bus extension assembly and phased shorting bus 156 that may extend from a main bus compartment.

The rear switchgear section 114 may include in the various interior compartments of the illustrated switchgear housings 116, 120, 122 a main bus assembly, a ground bus assembly interconnect, a potential transformer (PT) and control power transformer (CPT) jump bus assembly, a line bus assembly, a cable compartment, various bus bars and other associated electric components. The front section upper and lower switchgear housings 104, 106, 108, 110 include doors 104*a*, 106*a*, 108*a*, 110*a* for each switchgear housing to permit access into each interior compartment 128.

Figure 2:
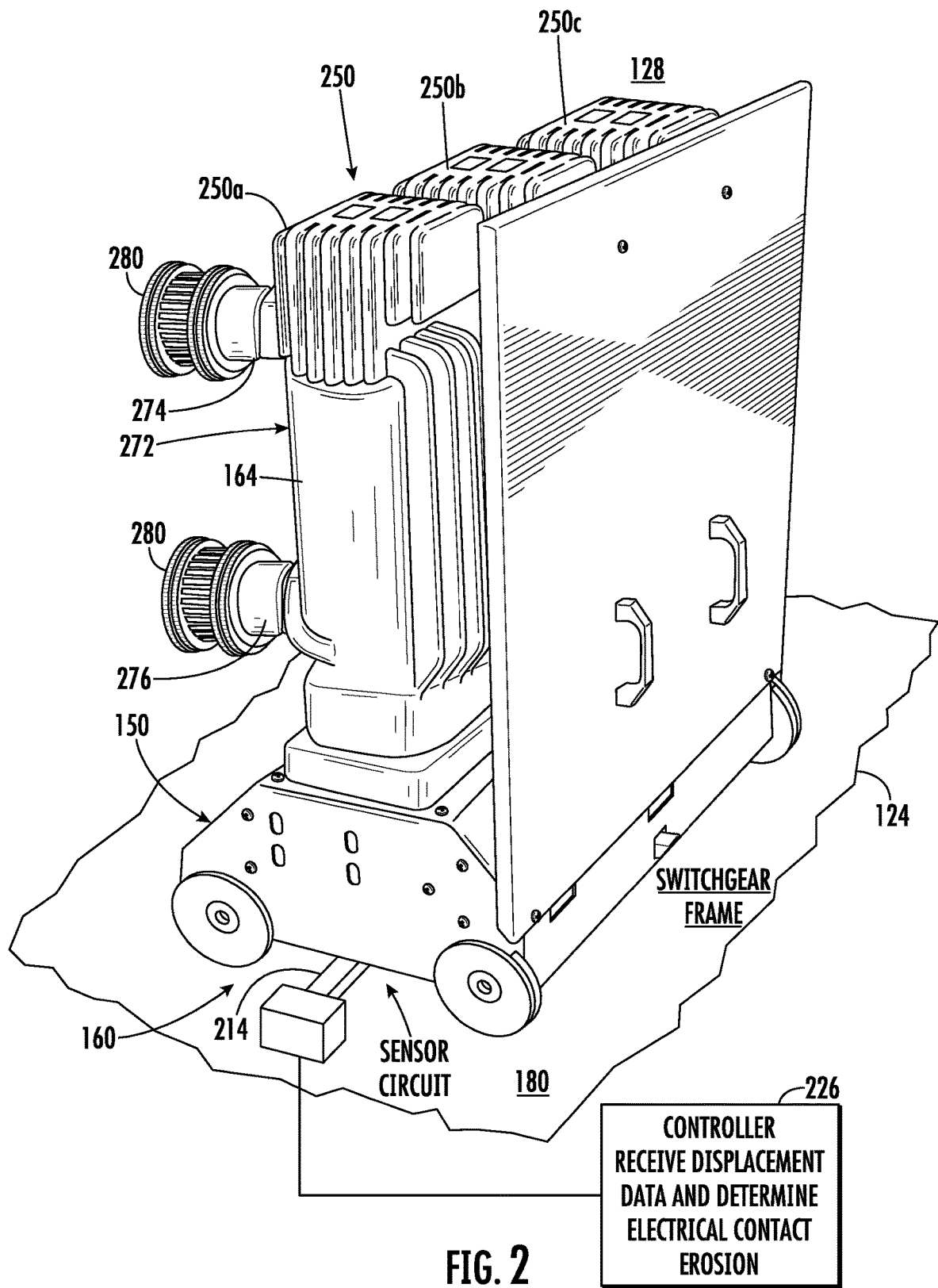
FIG. 2 is a schematic isometric view of a truck carrying a circuit breaker and showing a sensor circuit positioned under the truck in accordance with a non-limiting example.
Figure 3:
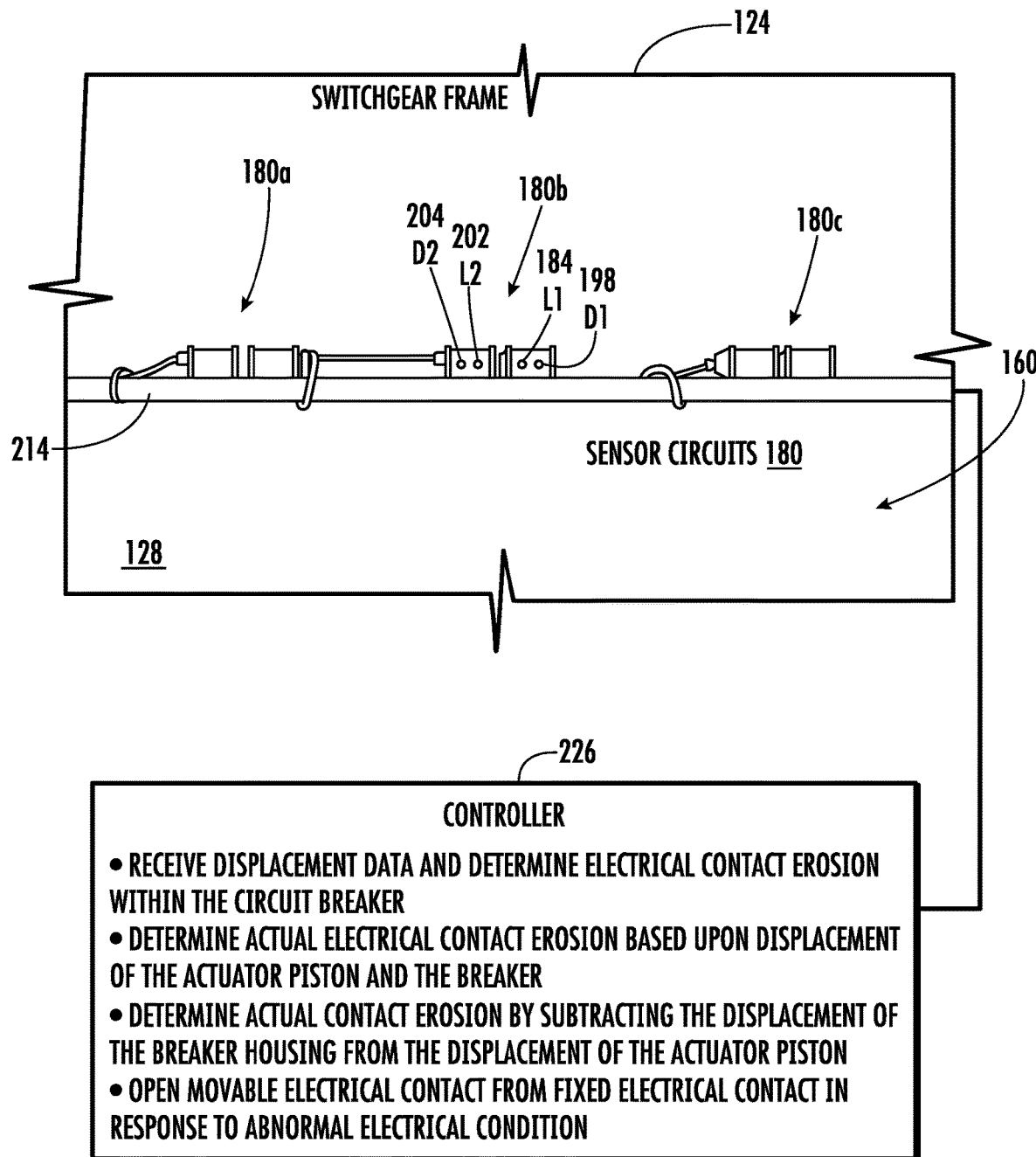
FIG. 3 is a schematic plan view of a sensor circuit and first, second and third sensor circuits that may be mounted under the truck within the switchgear frame, or on a test platform.
Figure 4:
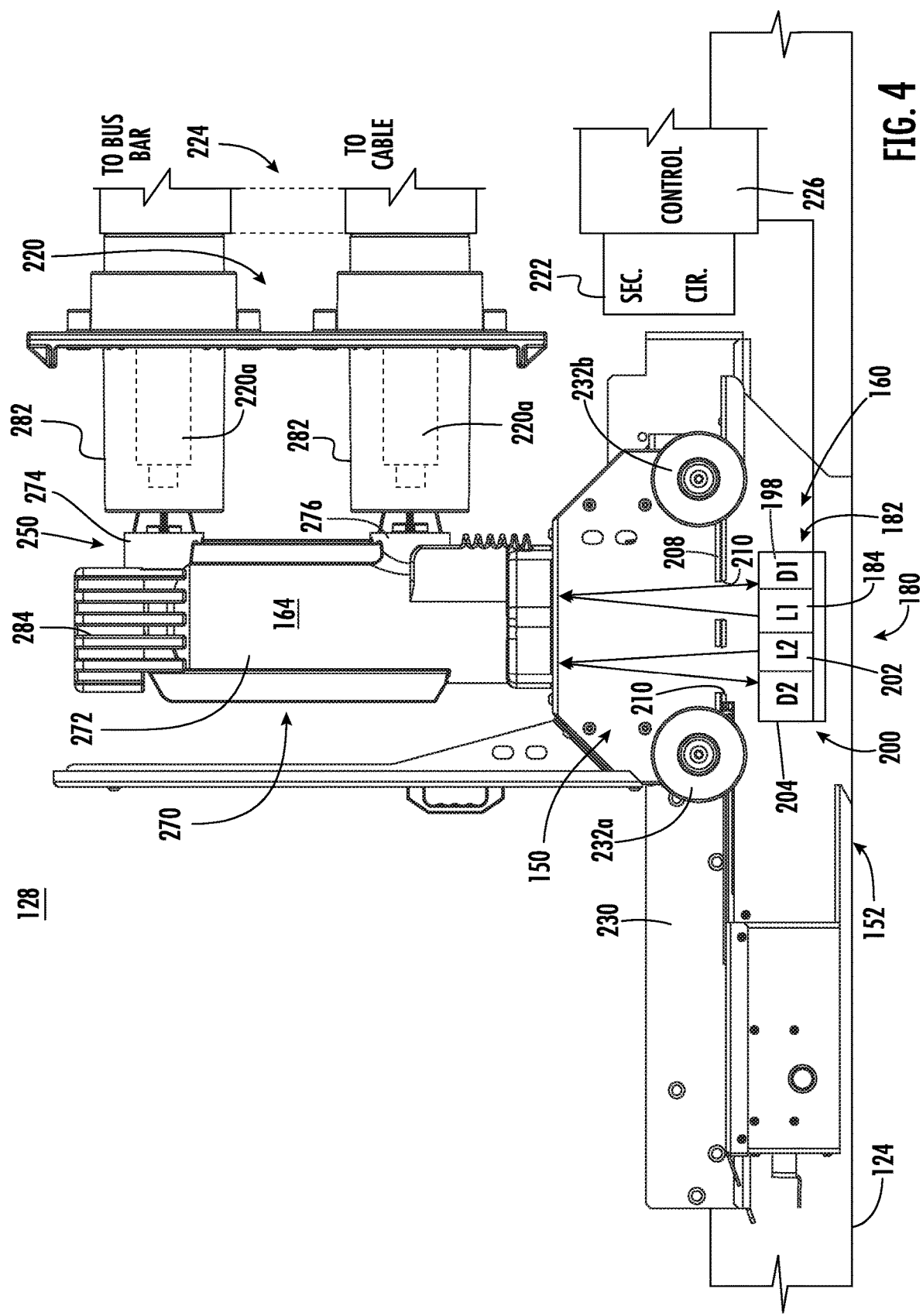
FIG. 4 is a sectional side elevation view of the circuit breaker and drive mechanism showing in section the sensor circuit in a contact testing position in accordance with a non-limiting example.

Referring now to FIGS. 2-4, the switchgear system 100 is illustrated as having a switchgear frame 124 with an interior compartment 128. A circuit breaker truck 150 carries the circuit breaker 250 and is supported for movement on the switchgear frame 124 within the interior compartment 128 into a contact testing position, such as illustrated at 160, where electrical contact erosion may be determined within the circuit breaker. The circuit breaker 250 includes a breaker housing 164, which in this example is formed as a vacuum interrupter 270 (FIG. 4).

Figure 5:
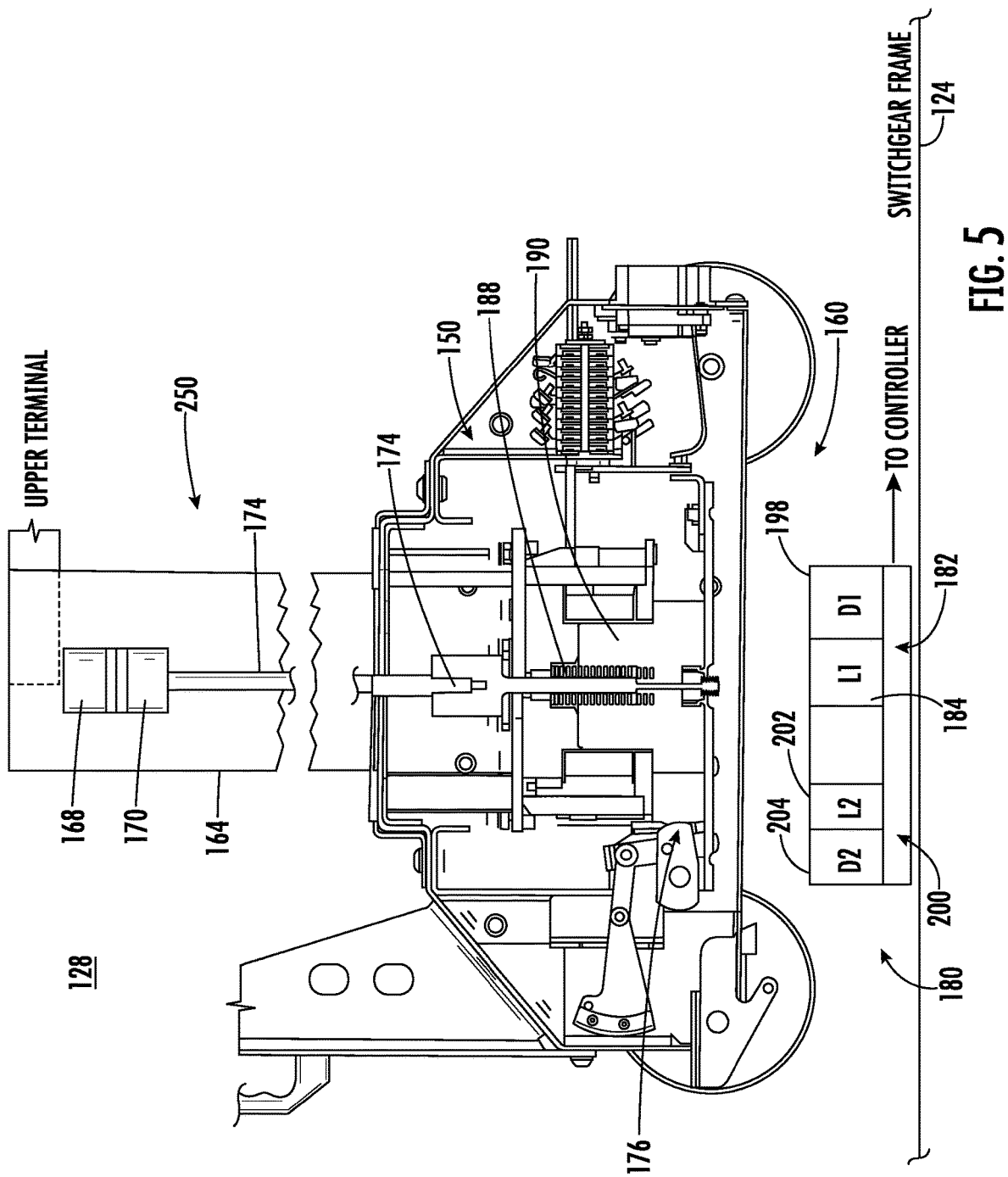
FIG. 5 is a partial side sectional view of the truck carrying the circuit breaker and showing the sensor circuit on the switchgear frame under the truck and aligned with the circuit breaker in a contact testing position.

As best shown in FIG. 5, the breaker housing 164 supports a fixed electrical contact 168 and a movable electrical contact 170 are mounted within the breaker housing 164. The movable electrical contact 170 is movable between an open and closed position relative to the fixed electrical contact 168. An actuator piston 174 is connected to the movable electrical contact 170 and extends downward from the breaker housing 164. A drive assembly 176 is coupled to the actuator piston 174 and configured to drive the actuator piston and move the movable electrical contact 170 between open and closed positions relative to the fixed electrical contact 168.

As best shown in FIG. 3, a sensor circuit 180 is illustrated and includes first, second and third sensor circuits 180*a*, 180*b*, 180*c*, and is mounted on the switchgear frame 124 under the circuit breaker truck 150 and aligned with the circuit breaker 250 when in the contact testing position 160 and configured to acquire displacement data of the actuator piston 174 when the movable electrical contact 170 is moved between the open and closed positions. A controller 226 is coupled to the sensor circuit 180 and configured to receive the displacement data and determine electrical contact erosion within the circuit breaker 250.

In an example, each sensor circuit 180 includes a first laser circuit 182 having a first laser 184 that is configured to emit a first optical beam as light onto a surface of the actuator piston 174. The term "actuator piston" as used herein for purposes of receiving an optical signal includes those components that are directly or indirectly connected to the movable electrical contact 170 and operate together to drive or direct the movable electrical contact into and out of engagement with the fixed electrical contact 170 and may be used for determining displacement of the actuator piston. Example components may include an actuator spring 188 and for displacement purposes, a cylindrically configured actuator block 190 engaging the actuator spring as best shown in the sectional view of FIGS. 5 and 6. The term "actuator piston" may also include any support plates or other support members such as a transverse extending support plate 192 that includes a circular configured mounting member 194 as shown in the underside view of the circuit breaker 250 of FIG. 7. The transverse extending support plate 192 and its circular configured mounting member 194 engage in this example the actuator block 190 and operate in conjunction with the drive assembly 176.

Figure 7:
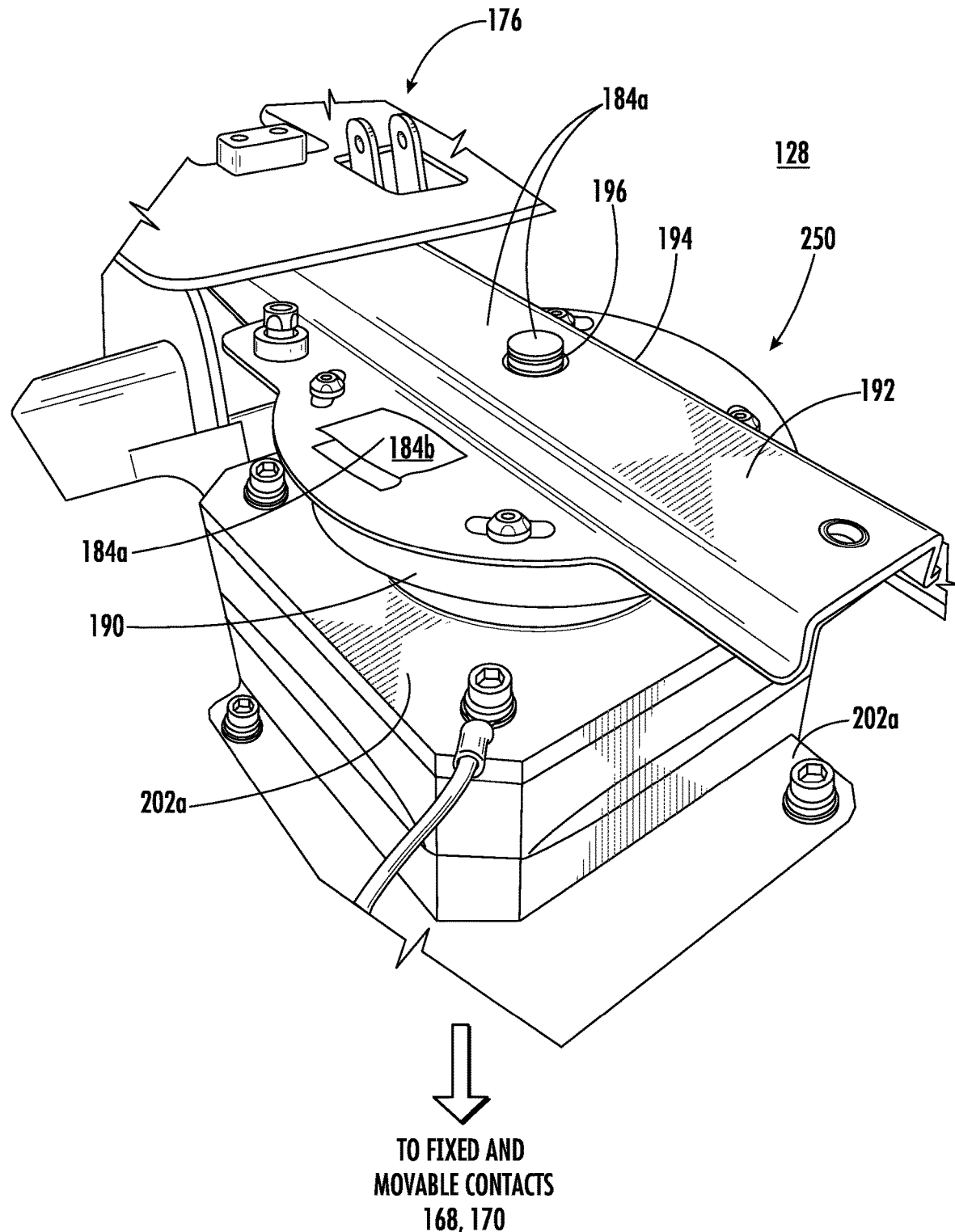
FIG. 7 is an isometric view of the underside of a circuit breaker and showing locations where first and second optical beams may be reflected from the actuator piston and breaker housing.

As shown in FIG. 7, the transverse extending support plate 192 and circular configured mounting member 194 are also connected to the threaded end 196 of the actuator piston 174. A first optical sensor 198 as a detector (D1) receives the reflected light that has been emitted as the first optical beam from a reflective surface of the actuator piston 174, which may be a surface such as the threaded end 196 of the actuator piston 174 or the actuator block 190, or part of the transverse extending support plate 192. The sensor circuit 180 further includes a second laser circuit 200 having a second laser 202 configured to emit a second optical beam onto a surface of the circuit breaker housing 164. A second optical sensor 204 as a detector (D2) receives the reflected light from the surface of the breaker housing 164 that had been emitted as the second optical beam from the second laser 202.

The controller 226 is configured to determine actual electrical contact erosion based upon the displacement of the actuator piston 174 and circuit breaker housing 164. During an electrical short circuit or other similar abnormal electrical condition that is detected by components of the switchgear system 100, the drive assembly 176 coupled to the actuator piston 174 may aid in driving the actuator piston and move the movable electrical contact 170 into an open position relative to the fixed electrical contact 168. During that circuit breaker interrupt, not only do the actuator piston 176 and associated components move, but also the circuit breaker housing 164 itself will move slightly in some examples at a few millimeters, e.g., 1-3 millimeters and in a decreasing damping or oscillation manner. Using the measured displacement of the actuator piston 174 and the circuit breaker housing 164, it is possible for the controller 226 to determine actual movement and thus contact erosion by subtracting the displacement of the breaker housing from the displacement of the actuator piston.

The controller 226 may also be configured to recalibrate the position of the fixed electrical contact 168 and movable electrical contact 170 based upon the displacement data obtained from movement of the actuator piston 174 and breaker housing 164. In an example, the circuit breaker truck 150 may include a bottom panel 208 (FIG. 4) having orifices 210 aligned with the respective first and second lasers 184, 202 to allow the respective first and second optical beams emitted from the first and second lasers 184, 202 to pass upward through the orifices 210 located in the bottom panel 208 to respective surfaces of the actuator piston 174 and breaker housing 164 and be reflected therefrom to determine displacement data.

As shown in FIG. 2, first, second and third circuit breakers 250*a*, 250*b*, 250*c* are carried on the circuit breaker truck 150, and first, second and third sensor circuits 180*a*, 180*b*, 180*c* (FIG. 3) are mounted on the switchgear frame 124 underneath the truck and aligned with respective first, second and third circuit breakers when in the contact testing position 160. As shown in the schematic diagram of FIG. 3, a sensor support bar 214 supports the first, second and third sensor circuits 180*a*, 180*b*, 180*c*, each having first and second lasers 184,202 and the first and second optical sensors 198,204 as best shown in FIG. 4 showing a single sensor circuit. The first, second and third circuit breakers 250*a*, 250*b*, 250*c* are electrically connected in a three-phase circuit breaker configuration.

The drive assembly 176 that is connected to the actuator piston 174 may be configured to open the movable electrical contact 170 from the fixed electrical contact 168 in response to an abnormal electrical condition, such as a short circuit, overcurrent, or other abnormal voltage level conditions. Electrical connectors formed in an example shown in FIG. 4 as primary circuit contacts 220*a* are carried within the interior compartment 128 of the switchgear frame 124 forming the housing, and the circuit breaker 250 includes upper and lower terminals formed as contact arms 274,276 that engage the electrical connectors as the primary circuit contacts when the circuit breaker is in an electrically connected position as shown in FIG. 4. It should be understood that this electrically connected position may also correspond to the contact testing position 160. Of course, the contact testing position 160 may be other positions with the switchgear frame 124 and interior compartment 128.

The circuit breaker drive mechanism 152 is mounted on the switchgear frame 124 and connected to the circuit breaker truck 150 and configured to rack in the truck where the circuit breaker is in the electrically connected position as shown in FIG. 4, and rack out the truck where the circuit breaker is electrically disconnected. In these examples, the circuit breaker housing 164 is formed as a vacuum chamber housing and the fixed and movable electrical contacts 168, 170 are sealed within the vacuum chamber housing.

As shown in FIG. 4, the circuit breaker truck 150 is configured for linear movement in the interior compartment 128. This circuit breaker truck 150 is supported for linear movement on the switchgear frame 124, in this example, movable on spaced, parallel side rails 230 with a side rail shown in the view of a portion of the interior compartment 128 at FIG. 4, illustrating the far section side rail 230 mounted on the interior inner side of the switchgear frame 124, and on which front and rear rollers 232a, 232b may be supported for translational rolling movement along the side rails 230 of the switchgear frame 124.

A side rail 230 may be mounted on each interior side of the switchgear frame 124 and positioned a few inches above any bottom floor section formed by the switchgear frame 124 and metal cladding. In the example shown in FIG. 4, the circuit breaker drive mechanism 152 may be mounted on the bottom section of the switchgear frame 124 forming the switchgear housing and connected to the truck 150, and configured to rack the truck and the circuit breaker 250 it carries into a first connected position where the primary circuits 220 and secondary control or test circuits 222 are electrically connected (FIG. 4), a circuit breaker test position where primary circuits are electrically disconnected and the secondary circuits are connected and a fully disconnected position where both primary and secondary circuits are disconnected.

The circuit breaker drive mechanism 152 may be configured to rack out the truck 150 and the circuit breaker 250 into a second circuit breaker test position where the primary circuit 220 is electrically disconnected and the secondary circuit 222 is connected to the secondary control or test circuits. The electrically connected position as described may also correspond to the electrical contact testing position 160. However, other locations may be used for the contact testing position 160.

Secondary connectors as part of the secondary circuit 222 may include a cable or other secondary connection to connect and complete the secondary circuit for testing and/or control. The drive mechanism 152 may also be configured to rack out the truck 150 into a third disconnected position where the primary and secondary circuits 220, 222 are electrically disconnected. Further details of an example of the circuit breaker drive mechanism 152 and other components are disclosed in U.S. patent application Ser. No. 17/422,540, filed Jul. 13, 2021, the disclosure which is hereby incorporated by reference in its entirety.

The circuit breaker 250 as illustrated in FIG. 2 is a three-phase circuit breaker and includes the first, second and third circuit breakers 250a, 250b, 250c each formed as a vacuum interrupter 270 (FIG. 4) and defines the three poles 272 for the three-phase circuit as first, second and third single-phase circuits with the upper portion of the poles each having its contact arm 274 that connects to a bus bar circuit, for example, as part of an input as a power supply and the primary circuit and the lower portion of the poles each having its contact arm 276 having connectors to connect to a cable assembly or other electrical circuit as part of the output and connected to a load.

Although only one vacuum interrupter 270 and one pole 272 is illustrated in FIG. 4, there are three vacuum interrupters 270 (FIG. 2) and associated poles across the width of the circuit breaker truck 150. Each vacuum interrupter 270 and pole 272 includes its upper contact arm 274 and lower contact arm 276 and includes connectors that may include a contact finger assembly shown generally at 280 in FIG. 2, which are received into primary circuit bushings 282 (FIG. 4) that are formed as a primary circuit housing to hold fixed primary circuit contacts 220a as shown in the dashed lines, and which engage the contact finger assemblies 280. The contact arms 274,276 may carry the contact finger assemblies 280 (FIG. 2) formed as tulip contacts in different configurations.

Each vacuum interrupter 270 operates as a switch and incorporates its movable electrical contact 170 and its fixed electrical contact 168 in a vacuum as part of the breaker housing 164, in this example, formed as a vacuum chamber housing. The separation of the electrical contacts 168, 170, such as during a short circuit or other abnormal electrical condition, or even for electrical contact testing, results in a metal vapor arc, which is quickly extinguished. This medium-voltage switchgear system 100 includes the medium-voltage, three-phase vacuum circuit breaker 250 having the three vacuum-interrupters 270. Each vacuum interrupter 270 may provide the fixed electrical contact 168 and movable electrical contact 170 in a flexible bellows to allow movement of the movable electrical contact in a hermetically-sealed ceramic with a high vacuum. The bellows may be made of stainless steel.

Vacuum interrupters may have a very long Mean Time to Failure (MTTF), and include high technology ceramic housings that impart a vacuum tightness with a resolution to the range of $10^{-7}$ hPa. The three-phase vacuum circuit breaker 250 as illustrated may operate with protective relays and other sensors to detect overcurrent or other abnormal or unacceptable conditions and signal the circuit breaker to switch open.

To maintain heat control in the circuit breaker 250, each pole 272 may include an insulator 284 as illustrated in FIG. 4. Protective relays and sensors may be formed as current transformers and potential transformers and temperature or pressure instruments and other sensing devices that may operate in the electrical switchgear environment. The vacuum interrupters 270 may operate at 5 KV, 15 KV, 27 KV, and 37 KV corresponding to the normal operating range of medium-voltage switchgear systems 100.

Figure 6:
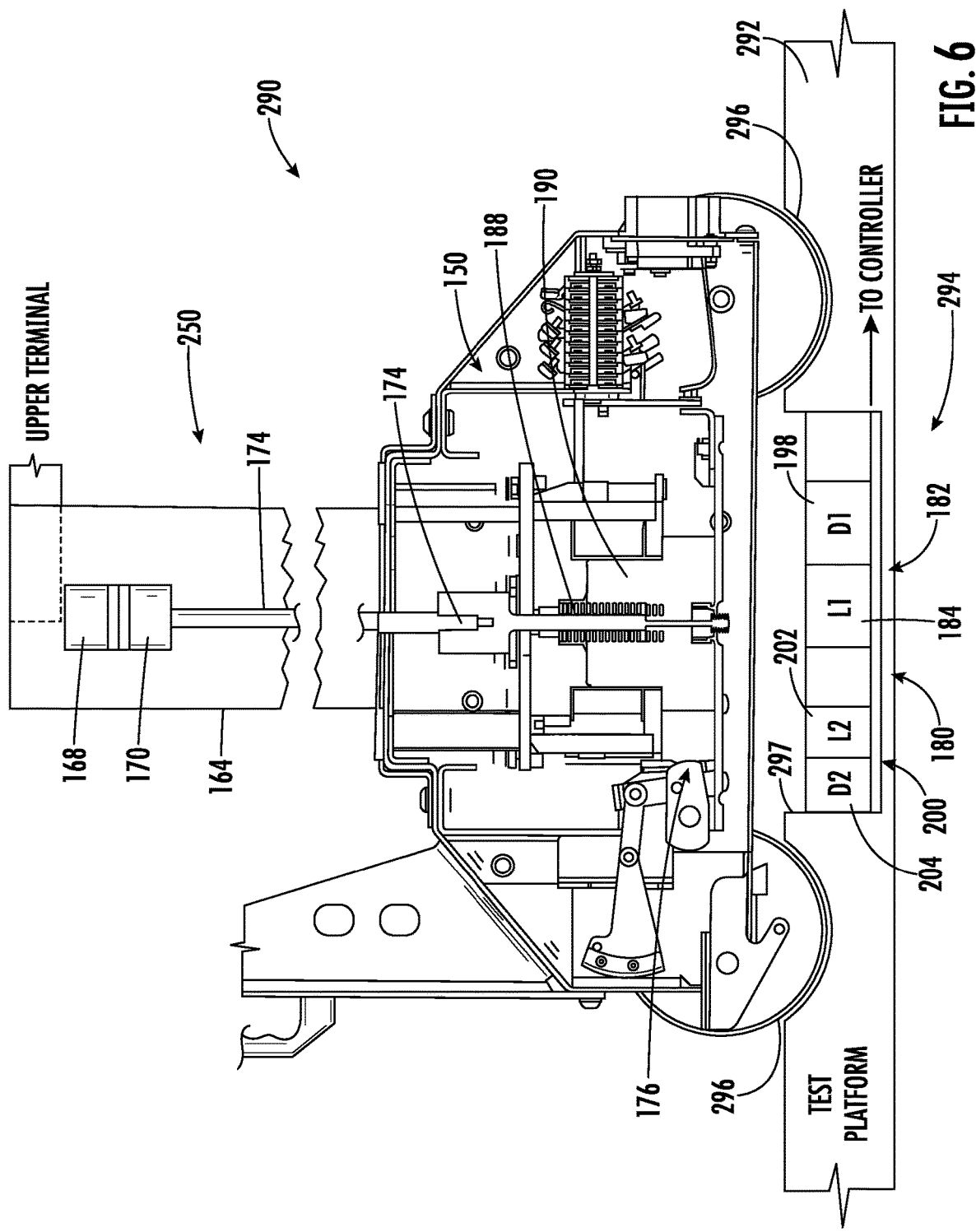
FIG. 6 is a side sectional view similar to that of FIG. 5, but showing the truck on a testing platform having a sensor circuit.

Referring now to FIG. 6, there is illustrated a testing system 290 for the circuit breaker 250 allowing the erosion contact test to be conducted while the truck 150 carrying the circuit breaker is removed from the switchgear frame 124 and housing and placed on a test platform illustrated generally at 292. In this example, the test platform 292 may be a rectangular or other geometrically shaped support platform that supports the truck 150 carrying the circuit breaker 250 in a contact testing position 294 on the test platform. In this example, the test platform 292 includes wheel chocks 296 or indentations formed in the test platform that position the truck 150 properly in the contact testing position 294 on the test platform. The sensor circuit 180 has a configuration similar to that shown in FIG. 3 and is mounted on the test platform 292 such as in a depression or cut-out 297 and positioned such that when the truck 150 rests on the test platform and the wheels engaged in the wheel chocks 296, the sensor circuit 180 is aligned with the proper circuit breaker 250 in the contact testing position 296.

The sensor circuit 180 operates similar to the sensor circuit described relative to FIGS. 2-5 and acquires displacement data of the actuator piston 174 and breaker housing 164 when the movable electrical contact 170 is moved between the open and closed positions. The test platform 292 includes three sensor circuits for three circuit breakers with each sensor circuit 180 having a first laser circuit 182 having the first laser 184 (L1) and first optical sensor 198 (D1) and second laser circuit 200 having the second laser 202 (L2) and second optical sensor 204 (D2) as described also with the sensor circuit 180 of FIGS. 2-5. In the example of FIGS. 2 and 3, a portion of the switchgear frame 124 is illustrated, but that section of the switchgear frame could correspond to a separate test platform 292 on which the truck 150 and mounted circuit breaker 250 will rest on after the truck is removed from the switchgear housing and placed on the test platform 292.

Referring again to FIG. 7, there is illustrated the underside of the circuit breaker 250 such as when positioned within a switchgear housing or on the test platform 292. This view shows various components as described before and shows relative positions of different surfaces on which the first and second optical beams may be emitted to different portions of the surfaces and reflected therefrom. The first references labeled 184*a* indicate possible surface locations on which the first optical beam from the first laser 184 may be directed and references labeled 202*a* correspond to possible surface locations in which the second optical beam from the second laser 202 may be directed.

Figure 8:
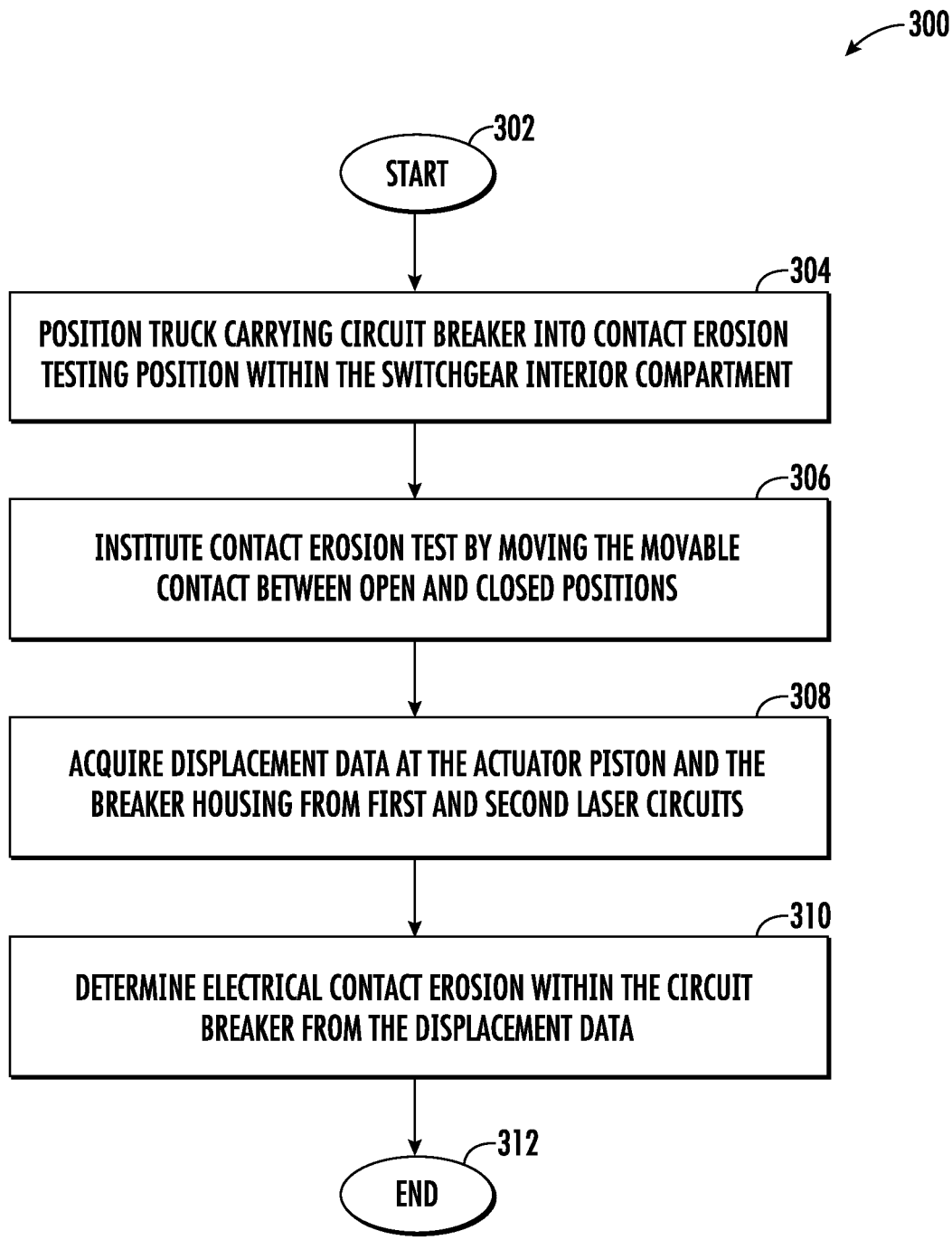
FIG. 8 is a flowchart showing a method of operating a switchgear system for determining electrical contact erosion within the circuit breaker using the switchgear system such as shown in FIG. 4.

Referring now to FIG. 8, there is illustrated generally at 300 a high-level flowchart showing a method of operating a switchgear system 100 for determining the electrical contact erosion of the electrical contacts 168, 170 within the circuit breaker 250. The process starts (Block 302) and a truck 150 carrying a circuit breaker 250 is positioned into a circuit testing position 160 within the switchgear interior compartment 128 (Block 304). A contact erosion test is instituted by moving the movable electrical contact 170 between open and closed positions (Block 306). Displacement data is acquired at the actuator piston 174 and the breaker housing 164 from the first and second optical beams emitted from first and second laser circuits 182,200 (Block 308). The electrical contact erosion is determined within the circuit breaker 250 from the displacement data (Block 310). The process ends (Block 312).

Figure 9:
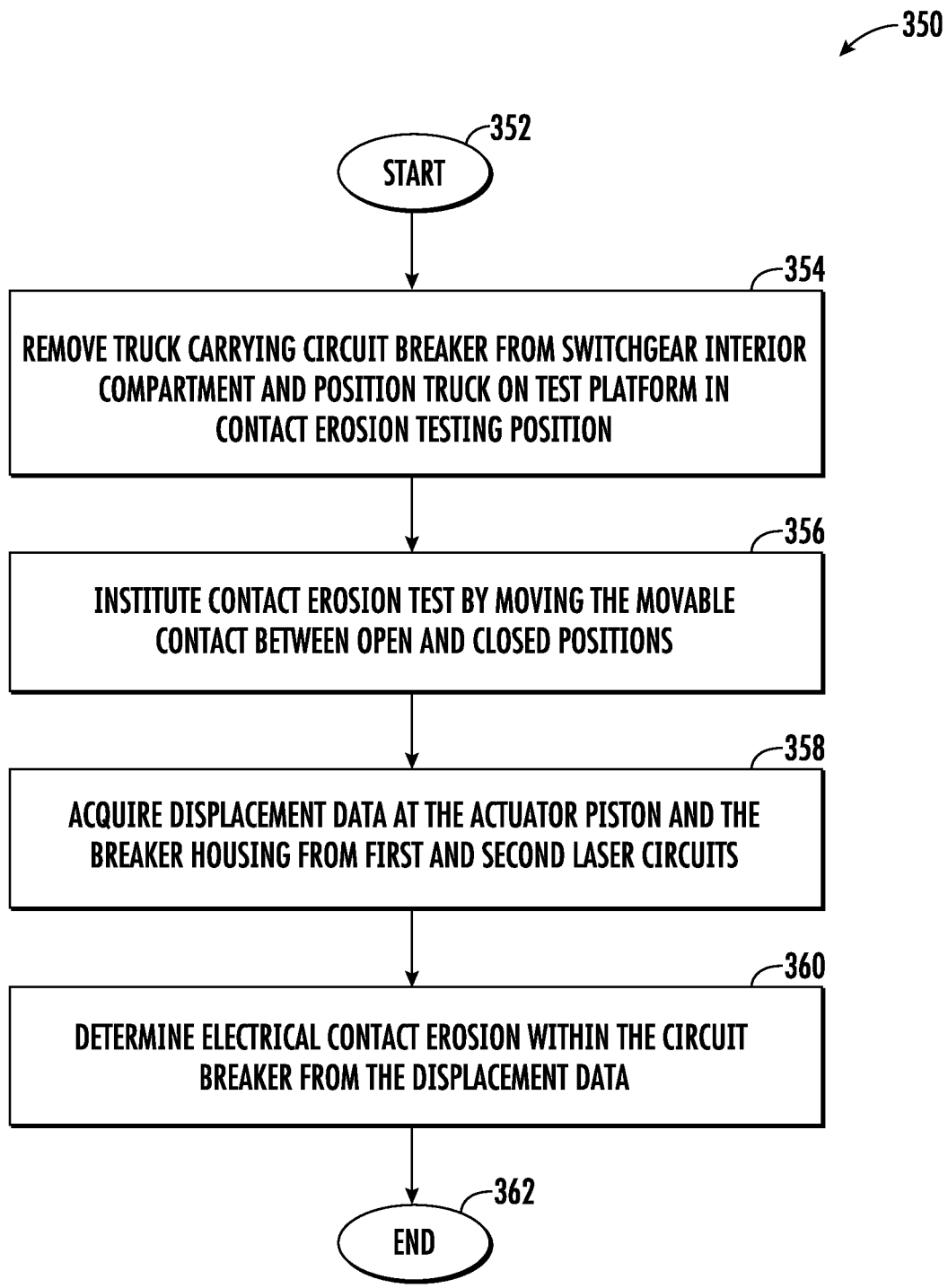
FIG. 9 is a high level flowchart of a method of operating a testing system for a circuit breaker using the test platform such as shown in FIG. 6.

Referring now to FIG. 9, there is illustrated a high-level flowchart generally at 350 and showing a method of operating the testing system 290 for the circuit breaker 250. The process starts (Block 352) and the truck 150 carrying the circuit breaker 250 is removed from the switchgear interior compartment 128, and the truck is positioned on the test platform 292 in the circuit testing position 160 (Block 354). The contact erosion test is instituted by moving the movable electrical contact 168 between open and closed positions (Block 356). Displacement data is acquired from the actuator piston 174 and the breaker housing 164 via the first and second laser circuits 182,200 (Block 358). The electrical contact erosion is determined within the circuit breaker 250 from the displacement data (Block 360). The process ends (Block 362).

In an example, the actuator piston 174 may be connected to the drive assembly 176 and include a stored energy mechanism that may include the actuator spring 188 and the actuator block 190. The actuator piston 174 and drive assembly 176 may include different stroke adjusters, lever shafts, and link rods that work in conjunction with the actuator spring 188 and actuator block 190. The actuator piston 174 and drive assembly 176 may include one or more magnetic actuators and a manual opening mechanism. A servomechanism or electromagnetic system may be used to compress the actuator spring 188 for stored energy.

It should also be understood that instead of an optical beam, it is possible to use an acoustic signal. The first and second optical sensors 198,204 may receive reflected light. In an example, they may operate using a position sensing device (PSD), charged coupled device (CCD), or CMOS devices. Other non-contact sensors may be used.

It is possible for the switchgear system 100 as described to obtain signal data during each arcing event for "real-time" data collection associated with the contact erosion status and/or expected service life remaining on the contacts of each circuit breaker. It is possible to provide dynamic evaluations and update in real-time the data to allow preventive maintenance scheduling and service without disengaging the circuit breaker 250 from an electrically connected position. As noted before, it is also possible to use an acoustic emitter and acoustic sensor instead of an optical laser and sensor or detector. It is also possible to use ultrasound sources and detectors.

The controller 226 may trigger the first and second laser circuits 182,200 and obtain signals corresponding to reflected light beams at successive intervals, such as in response to a trigger signal from a start of the movable electrical contact closing into a closed position, and a trigger signal from a start of opening of the movable electrical contact into an open position. These intervals can range from 50 microseconds to as much as 1 millisecond and values in between. In an example, the sensor circuits 180 can be movable along the sensor support bar 214 to allow adjustment at the contact testing position 160 when employed in the switchgear system 100 or along the testing position 294 on the test platform 292. Different adjustment mechanisms could be used such us slidable members on the first and second laser circuits received in grooves or slots of the sensor support laser 214.

If an acoustic emitter and sensor are used, the distance may be calculated by measuring the time required for ultrasonic waves to be sent and received based upon the speed of sound. An optical beam or acoustic waves may be emitted in a pulsed manner where displacement data and time may be translated to velocity with the slope of the distance versus a time curve. Different power sources for the first and second lasers and any optical sensors may be incorporated within the system 100.

Also, the different surfaces on which the optical beam may be directed and reflected may include a reflective coating, film or other adhesively attached reflective strips or patches that help in reflectivity and directing the optical beam or acoustic signal or other ultrasonic signal back to the respective optical sensor or other detector, such as shown in the reflective patch 184*b* in FIG. 7. Any optical beam may be scanned and the time may be measured using laser scanning techniques. Data acquisition intervals can vary from as little as 20 microseconds up to 3 microseconds with possible intermediate values. Travel curves can be provided from the displacement data. It is possible to use cloud computing as part of the controller 226 or a large network control center when there are many different circuit breakers and different switchgear frames and housings.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

The invention claimed is:

1. A testing system for a circuit breaker, comprising:
a truck configured to be inserted and removed from a switchgear housing, the truck carrying a circuit breaker, wherein the circuit breaker comprises a breaker housing having at least one movable contact and an actuator connected thereto;
a test platform that is positioned separate from the switchgear housing from which the truck has been removed, the test platform configured to support the truck carrying the circuit breaker in a contact testing position on the test platform, wherein the test platform comprises:
a sensor circuit mounted on the test platform and positioned under the truck and aligned with the circuit breaker when the truck is on the test platform in the contact testing position, wherein the sensor circuit is configured to acquire displacement data of the actuator; and
a controller coupled to the sensor circuit and configured to receive the displacement data and determine electrical contact erosion within the circuit breaker.

2. The testing system of claim 1, wherein said sensor circuit comprises a first laser configured to emit a first optical beam onto a surface of the actuator, and a first optical sensor that receives reflected light from the surface of the actuator.

3. The testing system of claim 2, wherein said sensor circuit further comprises a second laser configured to emit a second optical beam onto a surface of the breaker housing, and a second optical sensor that receives reflected light from the surface of the breaker housing, and wherein said controller is configured to determine actual electrical contact erosion based upon displacement of the actuator and breaker housing.

4. The testing system of claim 3, wherein said controller is configured to recalibrate the position of the at least one movable electrical contact based upon the displacement data obtained from movement of the actuator and breaker housing.

5. The testing system of claim 3, wherein said truck includes a bottom panel having orifices aligned with respective first and second lasers to allow the first and second optical beams from the first and second lasers to pass upward through the bottom panel to surfaces of the actuator and breaker housing.

6. The testing system of claim 3, wherein said controller is configured determine actual contact erosion by subtracting the displacement of the breaker housing from the displacement of the actuator.

7. A testing system for a circuit breaker, comprising:
a truck configured to be inserted and removed from a switchgear housing, the truck carrying a circuit breaker, wherein said circuit breaker comprises a breaker housing having at least one movable contact and an actuator connected thereto;
a test platform that is positioned separate from the switchgear housing from which the truck has been removed, the test platform configured to support the truck carrying the circuit breaker in a contact testing position on the test platform, wherein the test platform comprises:
a first laser circuit mounted on the test platform and positioned under the truck and aligned with the actuator of the circuit breaker when the truck is on the test platform in the contact testing position, and configured to emit a first optical beam and acquire displacement data of the actuator;
a second laser circuit mounted on the test platform and positioned under the truck and aligned with the breaker housing when the truck is on the test platform in the contact testing position, and configured to emit a second optical beam and acquire displacement data of the breaker housing; and
a controller coupled to the first and second laser circuits and configured to receive the displacement data of the actuator and breaker housing and determine electrical contact erosion within the circuit breaker based upon displacement data of both the actuator and breaker housing.

8. The testing system of claim 7, wherein said first laser circuit comprises a first optical sensor that receives reflected light from the surface of the actuator.

9. The testing system of claim 7, wherein said second laser circuit comprises a second optical sensor that receives reflected light from the surface of the breaker housing.

10. The testing system of claim 7, wherein said controller is configured to recalibrate the position of the at least one movable electrical contact based upon the displacement data obtained from movement of the actuator and breaker housing.

11. The testing system of claim 7, wherein said truck includes a bottom panel having orifices aligned with respective first and second lasers to allow the first and second optical beams from the first and second laser circuits to pass upward through the bottom panel to respective surfaces of the actuator and breaker housing.

12. The testing system of claim 7, wherein said controller is configured to determine actual contact erosion by subtracting the displacement of the breaker housing from the displacement of the actuator.

13. A method of operating a testing system for a circuit breaker, comprising:
removing a truck carrying a circuit breaker from a switchgear housing into a contact testing position on a test platform that is positioned separate from the switchgear housing from which the truck has been removed, wherein the circuit breaker comprises a breaker housing having at least one movable contact and an actuator connected thereto;
acquiring displacement data of the actuator using a sensor circuit mounted on the test platform and positioned under the truck and aligned with the circuit breaker when the truck is removed from the switchgear housing and in the contact testing position; and
receiving the displacement data within a controller coupled to the sensor circuit and determining electrical contact erosion within the circuit breaker.

14. The method of claim 13, wherein the sensor circuit comprises a first laser configured to emit a first optical beam onto a surface of the actuator, and a first optical sensor that receives reflected light from the surface of the actuator.

15. The method of claim 14, wherein the sensor circuit further comprises a second laser configured to emit a second optical beam onto a surface of the breaker housing, and a second optical sensor that receives reflected light from the surface of the breaker housing, and wherein said controller is configured to determine actual electrical contact erosion based upon displacement of the actuator and breaker housing.

16. The method of claim 15, wherein the controller is configured to recalibrate the position of the at least one movable electrical contact based upon the displacement data obtained from movement of the actuator and breaker housing.

17. A testing system for a circuit breaker, comprising:
a test platform configured to support a truck wherein the truck is configured to be inserted and removed from a switchgear housing that is separate from the test platform, the truck carrying a circuit breaker in a contact testing position on the test platform, wherein the circuit breaker includes a breaker housing having at least one movable contact and an actuator connected thereto;
a sensor circuit mounted on the test platform and positioned under the truck that had been removed from the switchgear housing and aligned with the circuit breaker when the truck is on the test platform in the contact testing position, wherein the sensor circuit is configured to acquire displacement data of the actuator; and
a controller coupled to the sensor circuit and configured to receive the displacement data and determine electrical contact erosion within the circuit breaker.

18. The testing system of claim 17, wherein said sensor circuit comprises a first laser configured to emit a first optical beam onto a surface of the actuator, and a first optical sensor that receives reflected light from the surface of the actuator.

19. The testing system of claim 18, wherein said sensor circuit further comprises a second laser configured to emit a second optical beam onto a surface of the breaker housing, and a second optical sensor that receives reflected light from the surface of the breaker housing, and wherein said controller is configured to determine actual electrical contact erosion based upon displacement of the actuator and breaker housing.

20. The testing system of claim 19, wherein said controller is configured to recalibrate the position of the at least one movable electrical contact based upon the displacement data obtained from movement of the actuator and breaker housing.

21. The testing system of claim 20, wherein said controller is configured determine actual contact erosion by subtracting the displacement of the breaker housing from the displacement of the actuator.

* * * * *